(12) United States Patent
Allen et al.

(10) Patent No.: US 8,421,168 B2
(45) Date of Patent: Apr. 16, 2013

(54) MICROELECTROMECHANICAL SYSTEMS MICROPHONE PACKAGING SYSTEMS

(75) Inventors: Howard Allen, Limington, ME (US); Luke England, Boise, ID (US); Douglas Alan Hawks, Escondido, CA (US); Yong Liu, Scarborough, ME (US); Stephen Martin, South Portland, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 335 days.

(21) Appl. No.: 12/947,543

(22) Filed: Nov. 16, 2010

(65) Prior Publication Data

US 2011/0121413 A1 May 26, 2011

Related U.S. Application Data

(60) Provisional application No. 61/262,050, filed on Nov. 17, 2009.

(51) Int. Cl.
*H01L 29/84* (2006.01)

(52) U.S. Cl.
USPC ........... 257/416; 257/415; 257/419; 257/686; 257/E21.613; 257/E29.324

(58) Field of Classification Search ................... 257/415, 257/416, 419, E29.324
See application file for complete search history.

(56) References Cited

U.S. PATENT DOCUMENTS

| | | | |
|---|---|---|---|
| 6,351,996 B1 | 3/2002 | Nasiri et al. | |
| 6,781,231 B2 | 8/2004 | Minervini et al. | |
| 7,166,910 B2 | 1/2007 | Minervini et al. | |
| 7,202,552 B2 | 4/2007 | Zhe et al. | |
| 7,221,767 B2 | 5/2007 | Mullenborn et al. | |
| 7,301,212 B1 | 11/2007 | Mian et al. | |
| 7,358,151 B2 | 4/2008 | Araki et al. | |
| 7,436,054 B2 | 10/2008 | Zhe | |

(Continued)

FOREIGN PATENT DOCUMENTS

| KR | 1020110055449 A1 | 5/2011 |
|---|---|---|
| WO | WO-2012040211 A2 | 3/2012 |

OTHER PUBLICATIONS

"International Application Serial No. PCT/US2011/052369, International Search Report mailed Apr. 24, 2012", 6 pgs.
"International Application Serial No. PCT/US2011/052369, Written Opinion mailed Apr. 24, 2012", 3 pgs.

(Continued)

*Primary Examiner* — Mamadou Diallo
(74) *Attorney, Agent, or Firm* — Schwegman, Lundberg & Woessner, P.A.

(57) ABSTRACT

This document discusses, among other things, a conductive frame, a silicon die coupled to the conductive frame, the silicon die including a vibratory diaphragm, the die having a silicon die top opposite a silicon die bottom, with a silicon die port extending through the silicon die to the vibratory diaphragm, with a silicon die terminal in electrical communication with the conductive frame and an insulator affixed to the conductive frame and the silicon die, with the insulator extending through interstices in the conductive frame to a conductive frame bottom of the conductive frame, and around an exterior of the silicon die to the silicon die top, with the insulator physically affixed to the silicon die and to the conductive frame, with the silicon die port exposed and with a conductive frame terminal disposed at the conductive frame bottom in electrical communication with the silicon die terminal.

20 Claims, 13 Drawing Sheets

U.S. PATENT DOCUMENTS

| | | |
|---|---|---|
| 7,539,003 B2 | 5/2009 | Ray |
| 7,622,782 B2 | 11/2009 | Chu et al. |
| 7,706,149 B2 | 4/2010 | Yang et al. |
| 7,781,249 B2 | 8/2010 | Laming et al. |
| 7,795,078 B2 | 9/2010 | Ramakrishna et al. |
| 2002/0178831 A1 | 12/2002 | Takada |
| 2005/0189635 A1 | 9/2005 | Humpston et al. |
| 2006/0034472 A1 | 2/2006 | Bazarjani et al. |
| 2006/0137457 A1 | 6/2006 | Zdeblick |
| 2007/0013052 A1 | 1/2007 | Zhe et al. |
| 2007/0040231 A1 | 2/2007 | Harney et al. |
| 2007/0047744 A1 | 3/2007 | Karney et al. |
| 2007/0071268 A1 | 3/2007 | Harney et al. |
| 2007/0099327 A1 | 5/2007 | Hartzell et al. |
| 2007/0165888 A1 | 7/2007 | Weigold |
| 2007/0205492 A1 | 9/2007 | Wang |
| 2007/0284682 A1 | 12/2007 | Laming et al. |
| 2008/0049230 A1 | 2/2008 | Chin et al. |
| 2008/0081398 A1 | 4/2008 | Lee et al. |
| 2008/0083958 A1 | 4/2008 | Wei et al. |
| 2008/0083960 A1 | 4/2008 | Chen et al. |
| 2008/0157301 A1* | 7/2008 | Ramakrishna et al. ....... 257/676 |
| 2008/0247585 A1 | 10/2008 | Leidl et al. |
| 2008/0302559 A1 | 12/2008 | Leedy |
| 2009/0175477 A1* | 7/2009 | Suzuki et al. ................. 381/355 |
| 2009/0263937 A1* | 10/2009 | Ramakrishna et al. ....... 438/123 |
| 2010/0155863 A1 | 6/2010 | Weekamp |
| 2010/0224004 A1 | 9/2010 | Suminto et al. |

OTHER PUBLICATIONS

"DigiSiMic™ Digital Silicon Microphone Pulse Part No. TC100E", TC100E Datasheet version 4.2 DigiSiMic™ Digital Silicon Microphone. (Jan. 2009), 6 pgs.

"EPCOS MEMS Microphone With TSV", 1 pg.

"T4020 & T4030 MEMS Microphones for Consumer Electronics", Product Brief 2010, Edition Feb. 2010, (2010), 2 pgs.

Krishnamurthy, Rajesh, et al., "Drilling and Filling, but not in your Dentist's Chair a look at some recent history of multi-chip and through silicon via (TSV) technology", Chip Design Magazine, (Oct./Nov. 2008), 7 pgs.

* cited by examiner

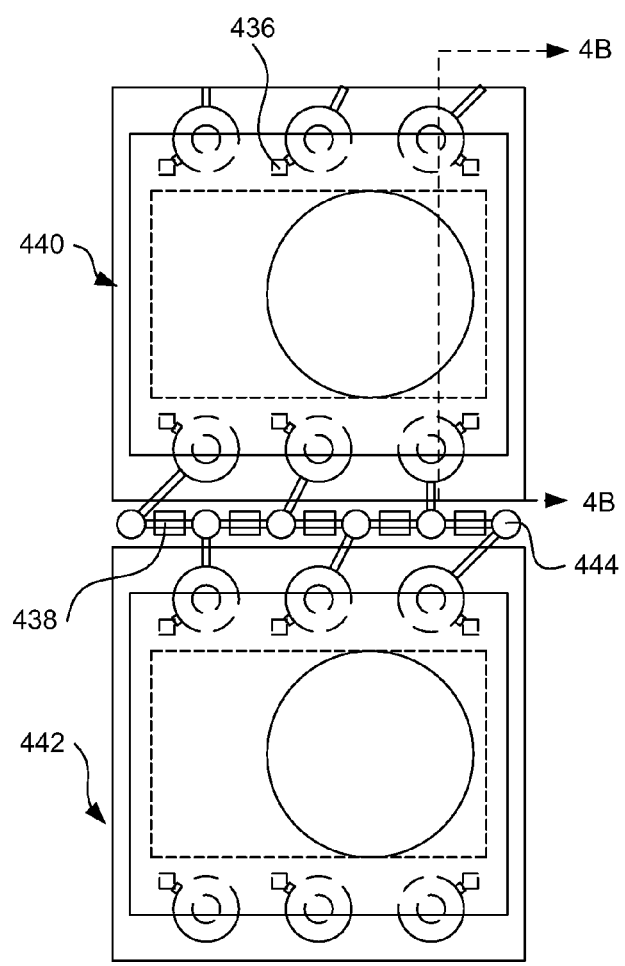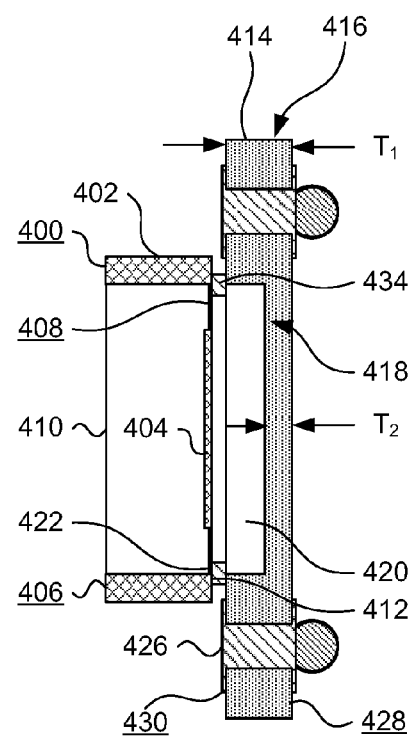
FIG. 4A
FIG. 4B

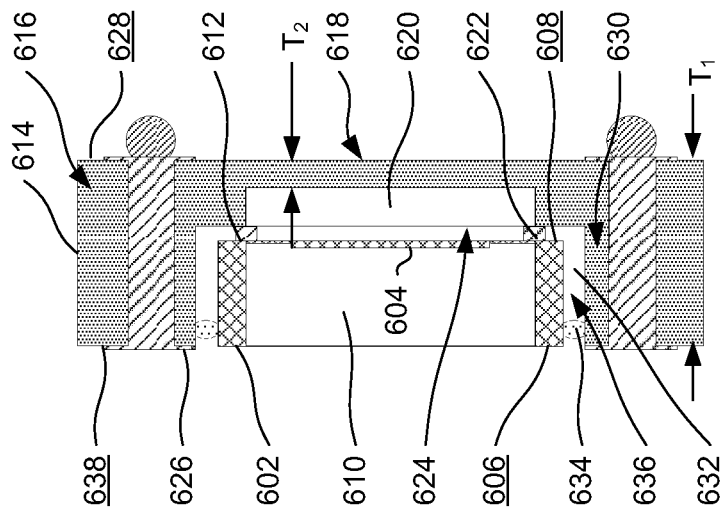
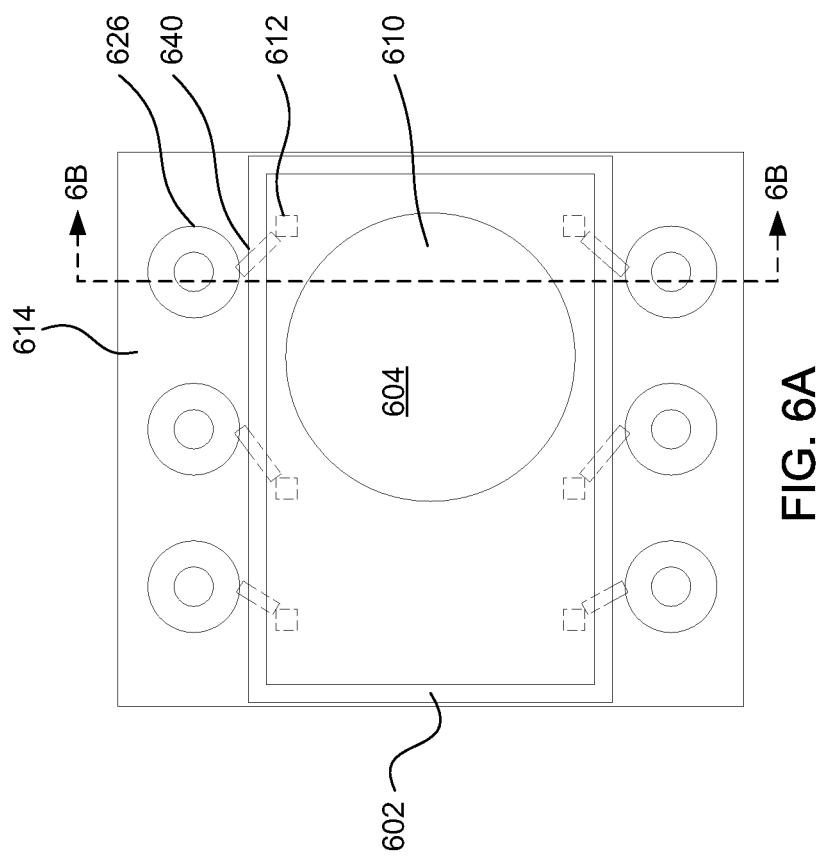

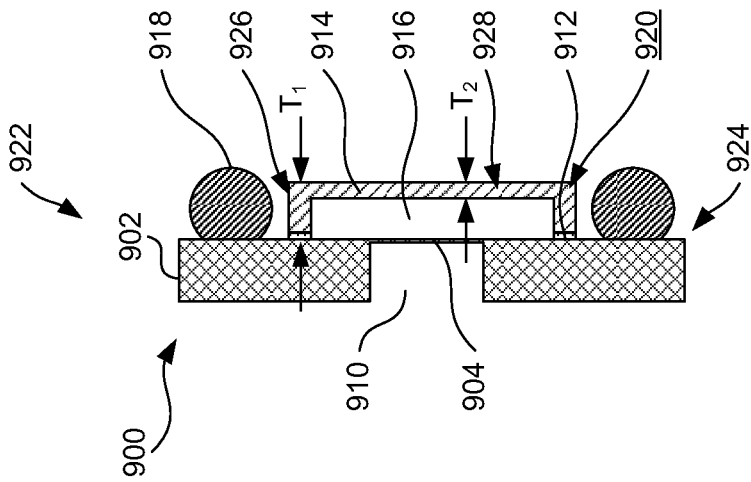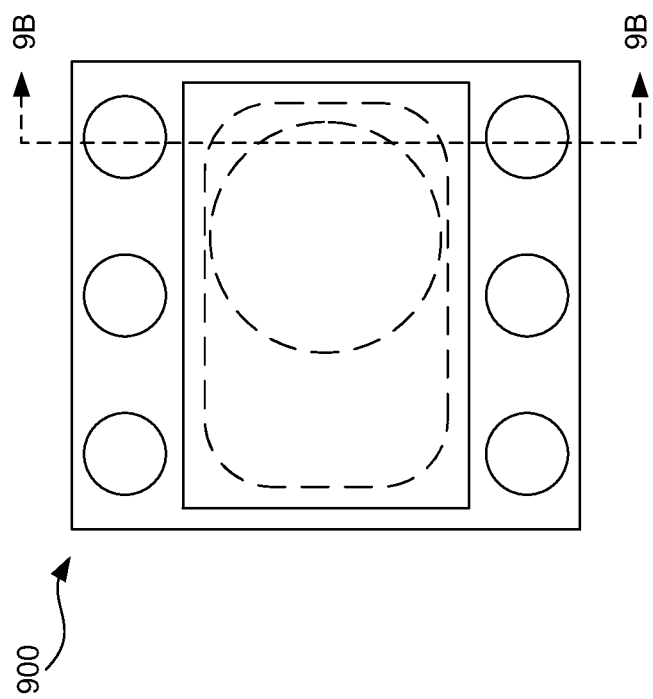
FIG. 9B
FIG. 9A

MICROELECTROMECHANICAL SYSTEMS MICROPHONE PACKAGING SYSTEMS

CLAIM OF PRIORITY

The present application claims the benefit of priority under 35 U.S.C. 119(e) of U.S. Provisional Patent Application Ser. No. 61/262,050, entitled "MEMS MICROPHONE DEVICE AND PACKAGES," filed Nov. 17, 2009, which is hereby incorporated by reference herein in its entirety.

BACKGROUND

Pressure transducers such as microphones, including microelectricalmechanical systems (MEMS) microphones, are used, such as for recording or playing sound. As market demand for devices such as personal electronics grows, device manufacturers benefit from smaller and less expensive microphone systems and methods.

OVERVIEW

This document discusses, among other things, a conductive frame, a silicon die coupled to the conductive frame, the silicon die including a vibratory diaphragm, the die having a silicon die top opposite a silicon die bottom, with a silicon die port extending through the silicon die to the vibratory diaphragm, with a silicon die terminal in electrical communication with the conductive frame and an insulator affixed to the conductive frame and the silicon die, with the insulator extending through interstices in the conductive frame to a conductive frame bottom of the conductive frame, and around an exterior of the silicon die to the silicon die top, with the insulator physically affixed to the silicon die and to the conductive frame, with the silicon die port exposed and with a conductive frame terminal disposed at the conductive frame bottom in electrical communication with the silicon die terminal.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 4A shows a top view of a packaged silicon die including a substrate including a cavity, and standoffs, according to an example.

FIG. 4B shows a partial cross section of FIG. 4A, taken along line 4B-4B.

FIG. 6A shows a top view of a packaged silicon die including a substrate including two cavities, and standoffs, according to an example.

FIG. 6B shows a cross section of FIG. 6A, taken along line 6B-6B.

FIG. 9A shows a top view of a packaged silicon die including a cap between terminals, according to an example.

FIG. 9B shows a cross section of FIG. 9A, taken along line 9B-9B.

DETAILED DESCRIPTION

This document discusses, among other things, packaging for MEMs-based microphones. MEMs-based microphones are quickly becoming the technology of choice for cell phones and other portable audio devices. Performance, cost and size are key factors contributing to the ultimate success of any portable/hand held microphone technology. By nature, MEMs microphones are delicate and the packaging technology must not only allow sound impingement on the acoustic diaphragm, but must also protect the same diaphragm from external environmental contaminants and stresses during manufacture and use. Current MEMs microphone package technology utilizes expensive and relatively large packaging and handset manufacturers in particular desire smaller form factor, lower cost devices.

The present subject matter provides improved packaging for silicon die such as MEMs microphones. An example provides packaging to form a sealed cavity against which a diaphragm of the silicon die can vibrate. An example provides packaging that provides electrical contact from a MEMS die bond pad to a system circuit. In an example, packaging is demonstrated which is simple to manufacture and robust in use, improving reliability. In an example, packaging is provided which integrates a silicon die with other components, such as packaging and/or processing electronics such as an application specific integrated circuit (ASIC) to provide a stand-alone computer component or chip that can be utilized in manufacturing a device, such as a personal electronics device, to provide microphone and/or speaker functions.

Figure 1A:
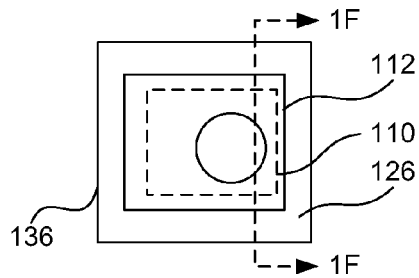
FIG. 1A shows a top view of a packaged silicon die including a half-etched conductive frame and flush insulator, according to an example.
Figure 1B:
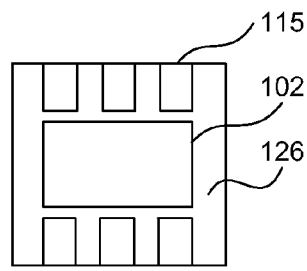
FIG. 1B shows a bottom view of the packaged silicon die of FIG. 1A.
Figure 1C:
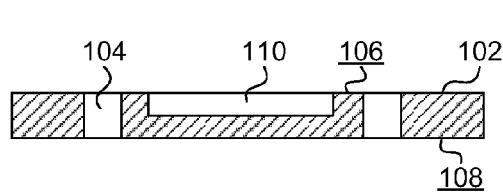
FIG. 1C shows a partial cross section of a conductive frame of the packaged silicon die of FIG. 1A.
Figure 1D:
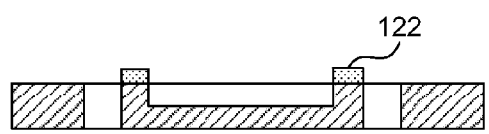
FIG. 1D shows a partial cross-section a conductive frame and adhesive of the packaged silicon die of FIG. 1A.
Figure 1E:
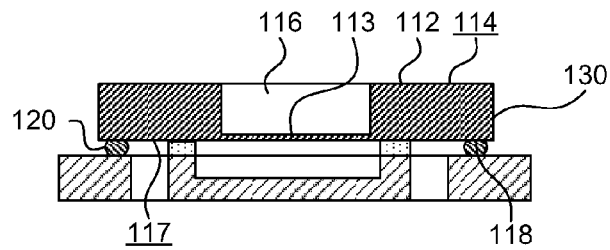
FIG. 1E shows a partial cross-section of a conductive frame, adhesive and a silicon die of the packaged silicon die of FIG. 1A.
Figure 1F:
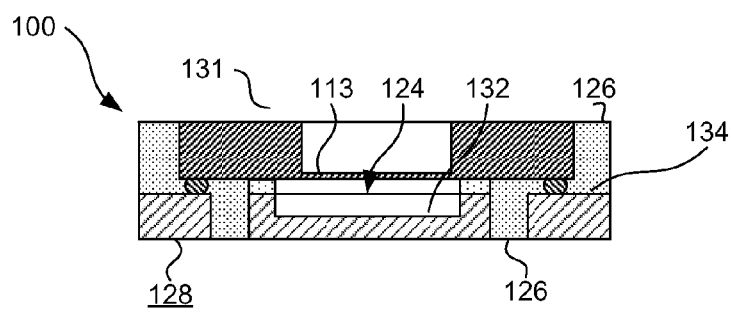
FIG. 1F shows a cross section of FIG. 1A, taken along line 1F-1F.

FIG. 1A shows a top view of a packaged silicon die including a half-etched conductive frame and flush insulator, according to an example. FIG. 1B shows a top view of the packaged silicon die of FIG. 1A. FIG. 1C shows a partial cross section of a conductive frame of the packaged silicon die of FIG. 1A. FIG. 1D shows a partial cross-section a conductive frame and adhesive of the packaged silicon die of FIG. 1A. FIG. 1E shows a partial cross-section of a conductive frame, adhesive and a silicon die of the packaged silicon die of FIG. 1A. FIG. 1F shows a cross section of FIG. 1A, taken along line 1F-1F.

An example includes a conductive frame 102. The conductive frame 102 includes a leadframe, according to an example. Leadframe examples disclosed herein include copper, but other materials and alloys are possible. In an example, a leadframe includes plating. In an example, leadframe plating includes NiPdAu plating. The conductive frame 102 includes a micro leadframe package, according to an example. The conductive frame includes a clip-mounted frame, according to an example. In an example, a leadframe provides electromagnetic interference shielding for the silicon die. In various examples, the conductive frame 102 defines one or more interstices 104. In some examples, the interstices 104 extend through a conductive frame, from a top 106 to a bottom 108 of the conductive frame 102. In some examples, the interstices 104 extend partially though the conductive frame 102. In an example, the cavity 110 extends partially into the conductive frame 102. In an example, the cavity is produced by half-etching the conductive frame 102, but the present subject matter is not so limited. Other examples are formed by other forms of etching, milling, routing and the like. In an example, a leadframe strip is molded using film-assisted molding to reduce or prevent mold compound from entering a silicon die port or a cavity. In an example components in assembly are saw singulated to produce a final package.

In an example, a silicon die 112 is coupled to the conductive frame 102. In an example, one or more terminals of the silicon die 112 are electrically conductive with one or more terminals 115 of the conductive frame 102. In an example, the silicon die includes a membrane or vibratory diaphragm 113. The die has a top 114 opposite a bottom 117, with a port 116 of the silicon die extending through the silicon die to the vibratory diaphragm 113. The silicon die 112 includes an electrical contact or terminal 118, according to an example. The electrical contact or terminal 118 includes a pad, according to an example. In an example, the silicon die 112 is in electrical communication with the conductive frame 102. In an example, a terminal ball such as a solder ball 120 is electrically and physically coupled to a terminal 118 of the silicon die 112 and the conductive frame 102. Terminal examples disclosed herein optionally include flip chip bumps, solder bumps or gold stud bumps. In an example, a silicon die 112 has 4 contacts, such as for analog communication. In an example, a silicon die 112 has 6 contacts, such as for digital communication. Lands or balls are to connect to one or more terminals or contacts of a silicon die, according to an example.

In an example, a silicon die, such as a silicon die 112 including a vibratory diaphragm 113, such as a MEMs microphone, is reversible, in that a sealed cavity can be disposed on either side of a vibratory membrane. In various examples, a vibratory diaphragm or membrane is around 400 micrometers in thickness, but other thicknesses can be used. In an example, a silicon die is less than or equal to approximately 1 millimeter in height, from the bottom 117 of the silicon die to the silicon die top 114. In an example, a silicon die includes a vibratory diaphragm or membrane that is flush with one side of the die. The silicon die includes a top port leading to the vibratory diaphragm, and a bottom port leading to the vibratory diaphragm, according to an example. In an example, a silicon die includes a silicon die port, or an acoustic port, on one side of a vibratory membrane, and a cavity on an opposite side of the vibratory membrane. In an example, a silicon die 112 illustrated includes a MEMs microphone with the port 116 extending from the top 114 of the silicon die to the vibratory diaphragm 113, wherein the first port is exposed.

In an example, an adhesive 122 seals the conductive frame 102 to the silicon die 112 to define a cavity 124. In an example an adhesive includes dispensed epoxy, anisotropic conductive film (ACF) and/or non-conductive film (NCF). The cavity disposed against a vibratory diaphragm is acoustically sealed according to an example. The cavity is from around 0.25 mm$^3$ to around 0.325 mm$^3$, according to an example. In an example, the cavity is 0.277 mm$^3$. In an example in which the die has one acoustic port leading to the vibratory membrane, the die is mounted to another component, such as a substrate or a cover, on a side opposite the acoustic port.

According to a method example, the die is released from the side including the membrane after wet die saw. The die is released from the side including the membrane before dry die saw according to a method example. In a method example, the membrane is released from a side of the silicon die opposite the side including the membrane. In a method example, a silicon die is singulated without impacting a membrane or vibratory diaphragm. Stealth laser sawing is used to singulate a silicon die, according to an example. According to an example, in order to produce a solderable surface on a silicon die without damaging a membrane through an audio port, no plating is performed with a port etched opened. In an example, under bump metallization (UBM) is performed prior to a port etch. In an example, solder flux is not cleaned after mounting of a silicon die.

In an example, a MEMs diaphragm can be released after any wet-processing requirements. In an example, plasma processing facilitates diaphragm release. In an example, a diaphragm can be protected from contaminants during assembly. In an example, vacuum is not applied to diaphragm during the assembly process. In an example, electromagnetic-interference shielding is disposed in area of diaphragm.

In an example, an insulator 126 is affixed to the conductive frame 102 and the silicon die 112. The insulator 126 includes a mold compound that is molded around the conductive frame 102 and the silicon die 112, according to an example. In an example, the insulator 126 includes a premolded compound. In an example, a port 116 is protected during molding, such as by using film assist molding. The insulator 126 extends through interstices 104 in the conductive frame 102 to a bottom 128 of the conductive frame, according to an example. In an example, the insulator 126 extends around an exterior 130 of the silicon die to a top 114 of the silicon die, with the insulator 126 physically affixed to the silicon die 112 and to the conductive frame 102. An exterior 136 of the packaged silicon die 100 is shaped like a hexahedron including six substantially continuous surfaces, according to an example. The present subject matter includes exteriors having other shapes. In an example, the silicon die port 116 is exposed to an atmosphere 131. In an example, a conductive frame terminal 115 is disposed on a bottom 128 at the conductive frame 128, surrounded by insulator 126, in electrical communication with the terminal 118 of the silicon die 112. In an example, the conductive frame includes a conductive frame cavity 132 disposed in the top 106 of the conductive frame, with the vibratory diaphragm 113 exposed to the cavity. The cavity 124 includes the conductive frame cavity 132 and space needed to accommodate the adhesive 122, according to an example.

Figure 2:
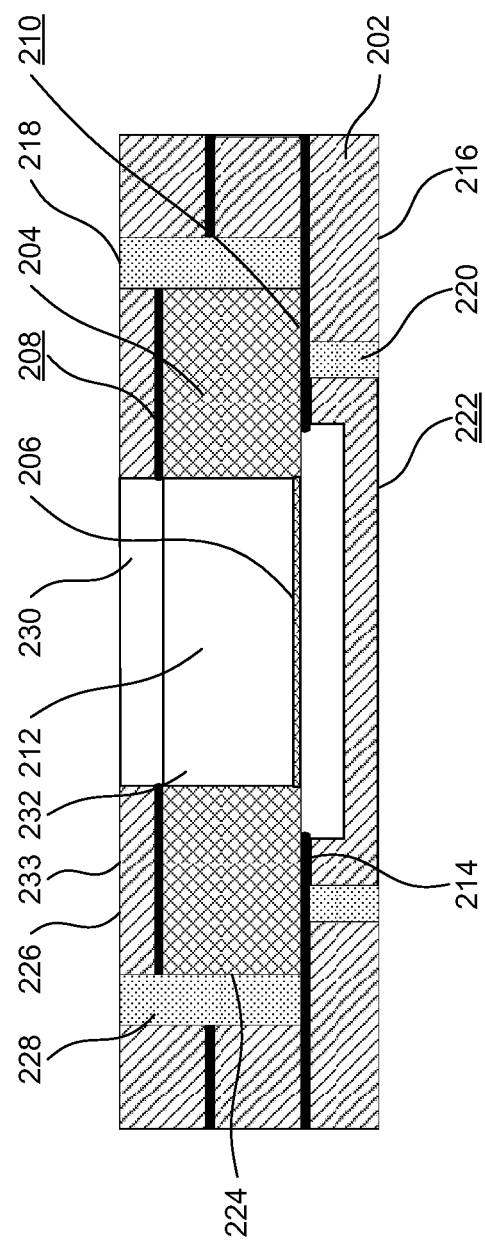
FIG. 2 shows a cross section of a packaged silicon die, including two half-etched conductive frames, according to an example.

FIG. 2 shows a cross section of a packaged silicon die, including two half-etched conductive frames, according to an example. In an example, a conductive frame 202 is coupled to a silicon die 204. The silicon die 204 includes a vibratory diaphragm 206. In an example, the silicon die includes a top 208 opposite a bottom 210, with a silicon die port 212 extending through the silicon die 204 to the vibratory diaphragm 206, with a terminal 214 of the silicon die 204 in electrical communication with the conductive frame 202, such as extending to a terminal 216 of the conductive frame 202. In an example, an insulator 218 is affixed to the conductive frame 202 and the silicon die 204, with the insulator 218 extending through interstices 220 in the conductive frame to a bottom 222 of the conductive frame 202, and around an exterior 224 of the silicon die 204, with the insulator 218 physically affixed to the silicon die 204 and to the conductive frame 202, with the silicon die port 212 exposed and with a conductive frame terminal 216 disposed at a bottom of the conductive frame in electrical communication with the terminal 214 of the silicon die. In an example, a second conductive frame 226 overlays the top 208 of the silicon die 204, with the insulator 126 extending through interstices 228 of the second conductive frame 226. The second conductive frame 226 defines a conductive frame port 230, with the silicon die 204 exposed through the port. In an example, the silicon die port 212 is exposed through the conductive frame port 230. In an example, a of the silicon die are electrically connected to one or more terminals 233 of the second conductive frame, with the one or more terminals 233 of the second conductive frame exposed through the insulator.

In an example, the second conductive frame 226 includes a second cavity 232, with the top 208 of the silicon die 204 disposed in the second cavity 232. The second cavity is a half-etched cavity, according to an example, but other cavities are possible, such as routed cavities, drilled cavity, etched cavities and the like.

Figure 3A:
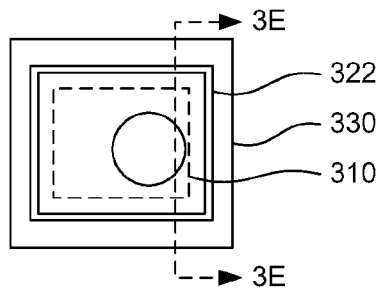
FIG. 3A shows a top view of a packaged silicon die including a molded cavity, according to an example.
Figure 3B:
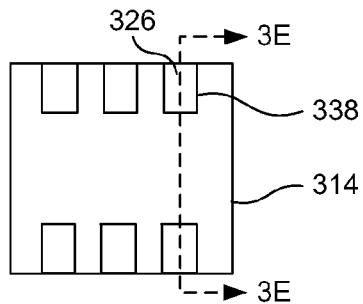
FIG. 3B shows a bottom view of the packaged silicon die of FIG. 3A.
Figure 3C:
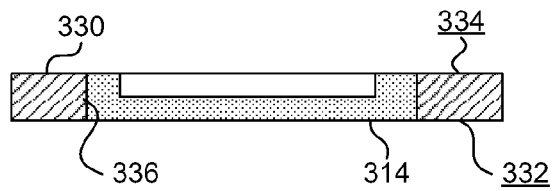
FIG. 3C shows a partial cross-section a conductive frame and insulator of the packaged silicon die of FIG. 3A.
Figure 3D:
FIG. 3D shows a partial cross-section of a conductive frame, adhesive and a silicon die of the packaged silicon die of FIG. 3A.
Figure 3E:
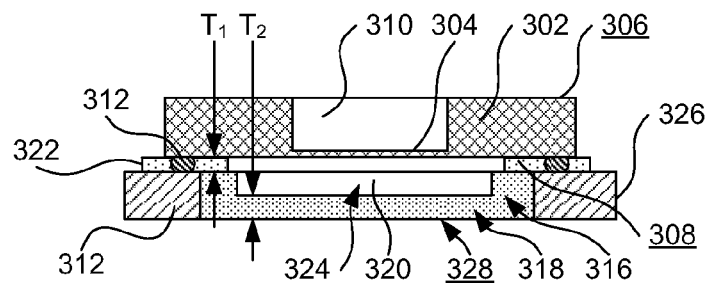
FIG. 3E shows a cross section of FIG. 3A, taken along line 3E-3E.

FIG. 3A shows a top view of a packaged silicon die including a molded cavity, according to an example. FIG. 3B shows a bottom view of the packaged silicon die of FIG. 3A. FIG. 3C shows a partial cross-section a conductive frame and insulator of the packaged silicon die of FIG. 3A. FIG. 3D shows a partial cross-section of a conductive frame, adhesive and a silicon die of the packaged silicon die of FIG. 3A. FIG. 3E shows a cross section of FIG. 3A, taken along line 3E-3E. In an example, a silicon die 302 includes a vibratory diaphragm 304, a top 306 opposite a bottom 308, with a silicon die port 310 extending through the silicon die 302 to the vibratory diaphragm 304, the silicon die 302 including a terminal 312 disposed on the bottom 308 of the silicon die 302. In an example, an insulator 314 is coupled below the die, the insulator 314 being of a first thickness $T_1$ along a first portion 316 and a of second thickness $T_2$ less than the first thickness $T_1$ along a second portion 318 surrounded by the first portion, with the first portion 316 and the second portion 318 at least in part defining a cavity 320, with the vibratory diaphragm 304 of the silicon die 302 disposed over the cavity 320 and with the cavity 320 opening to the vibratory diaphragm 304. In an example, a seal 322 surrounds a space defined between the cavity and the vibratory diaphragm to define a sealed cavity 324 and a conductor 326 electrically conductive with and extending from the terminal 312 of the silicon die 302 to a bottom 328 of the insulator 314. An example includes a conductive frame 330 with a conductive frame top 334 opposite a conductive frame bottom 332, the silicon die 302 mounted to the conductive frame top 334 with a frame port 336 extending through the conductive frame 330 from the conductive frame top 334 to the conductive frame bottom 332, wherein the insulator 314 is molded into the conductive frame port 336. In an example, the conductor 326 includes a portion of the bottom 332 of the conductive frame 330 and is flush with the bottom 328 of the insulator 314. In an example, the insulator 314 extends around the conductor 326 to define a pad 338. The silicon die 302 includes a MEMs microphone that includes the vibratory diaphragm 304, with the silicon die port 310 extending from the top 306 of the silicon die to the vibratory diaphragm 304.

FIG. 4A shows a top view of a packaged silicon die including a substrate including a cavity, and standoffs, according to an example. FIG. 4B shows a partial cross section of FIG. 4A, taken along line 4B-4B. In an example, a silicon die 402 includes a vibratory diaphragm 404, a top 406 opposite a bottom 408, with a silicon die port 410 extending through the silicon die 402 to the vibratory diaphragm 404, the silicon die 402 including a terminal 412 disposed on the bottom 408 of the silicon die 402. In an example, an insulator 414 is coupled below the die, the insulator 414 being of a first thickness $T_1$ along a first portion 416 and a of second thickness $T_2$ less than the first thickness $T_1$ along a second portion 418 surrounded by the first portion, with the first portion 416 and the second portion 418 at least in part defining a cavity 420, with the vibratory diaphragm 404 of the silicon die 402 disposed over the cavity 420 and with the cavity 420 opening to the vibratory diaphragm 404. In an example, a seal 422 surrounds a space defined between the cavity and the vibratory diaphragm to define a sealed cavity 424 and a conductor 426 electrically conductive with and extending from the terminal 412 of the silicon die 402 to a bottom 428 of the insulator 414. An example includes organic substrate based packaging. In an example, the insulator 414 includes a printed circuit board with a top 430 opposite a bottom 428, the silicon die 402 mounted to the top 430 of the printed circuit board, with the cavity 420 disposed into the printed circuit board. In an example, the insulator includes a resin-based bismaleimide-Triazine (BT) substrate, with a top opposite a bottom, with the silicon die mounted to the top of the BT substrate. The cavity is disposed into the BT substrate, according to an example. The cavity is excised in the printed circuit board, according to an example. The conductor 426 includes a via through the printed circuit board, according to an example. The seal includes an adhesive 434 adhering the silicon die 402 to the printed circuit board, according to an example.

The insulator 414 such as a circuit board includes traces 436 extending between the terminal 412 and the conductor 426, according to an example. An example includes a scribe line 438 such as a metal scribe line that is etched after plating to electrically isolate a first substrate 440 from a second substrate 442. One or more substrate includes a test point 444, with traces 436 extending from a test point to a conductor 426 according to an example.

Figure 5A:
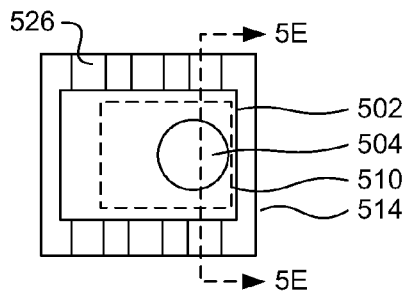
FIG. 5A shows a top view of a packaged silicon die including a substrate including a cavity and an internal conductor, according to an example.
Figure 5B:
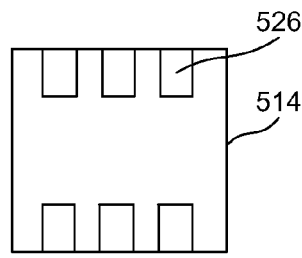
FIG. 5B shows a bottom view of the packaged silicon die of FIG. 5A.
Figure 5C:
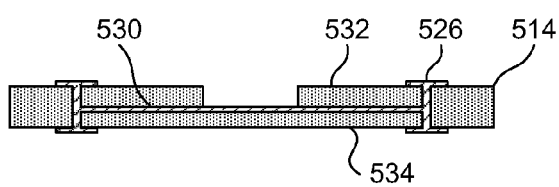
FIG. 5C shows a partial cross-section a substrate of the packaged silicon die of FIG. 5A.
Figure 5D:
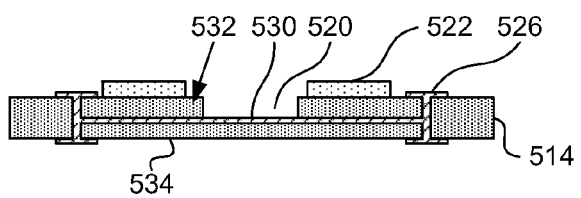
FIG. 5D shows a partial cross-section of a substrate, adhesive and a silicon die of the packaged silicon die of FIG. 5A.
Figure 5E:
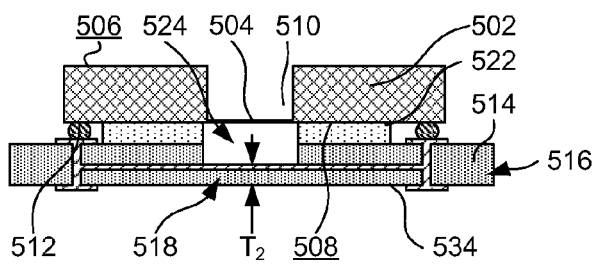
FIG. 5E shows a cross section of FIG. 5A, taken along line 5E-5E.

FIG. 5A shows a top view of a packaged silicon die including a substrate including a cavity and an internal conductor, according to an example. FIG. 5B shows a bottom view of the packaged silicon die of FIG. 5A. FIG. 5C shows a partial cross-section a substrate of the packaged silicon die of FIG. 5A. FIG. 5D shows a partial cross-section of a substrate, adhesive and a silicon die of the packaged silicon die of FIG. 5A. FIG. 5E shows a cross section of FIG. 5A, taken along line 5E-5E. In an example, a silicon die 502 includes a vibratory diaphragm 504, a top 506 opposite a bottom 508, with a silicon die port 510 extending through the silicon die 502 to the vibratory diaphragm 504, the silicon die 502 including a terminal 512 disposed on the bottom 508 of the silicon die 502. In an example, an insulator 514 is coupled below the die, the insulator 514 being of a first thickness $T_1$ along a first portion 516 and a of second thickness $T_2$ less than the first thickness $T_1$ along a second portion 518 surrounded by the first portion, with the first portion 516 and the second portion 518 at least in part defining a cavity 520, with the vibratory diaphragm 504 of the silicon die 502 disposed over the cavity 520 and with the cavity 520 opening to the vibratory diaphragm 504. In an example, a seal 522 surrounds a space defined between the cavity and the vibratory diaphragm to define a sealed cavity 524 and a conductor 526 electrically conductive with and extending from the terminal 512 of the silicon die 502 to a bottom 528 of the insulator 514. In an example, the printed circuit is a multilayer printed circuit board, with a the terminal 512 of the silicon die 502 coupled to a conductive layer 530 disposed between two layers 532, 534 of the printed circuit board. In an example a printed circuit board includes EMI shielding of the cavity.

FIG. 6A shows a top view of a packaged silicon die including a substrate including two cavities, and standoffs, according to an example. FIG. 6B shows a cross section of FIG. 6A, taken along line 6B-6B. In an example, a silicon die 602 includes a vibratory diaphragm 604, a top 606 opposite a bottom 608, with a silicon die port 610 extending through the silicon die 602 to the vibratory diaphragm 604, the silicon die 602 including a terminal 612 disposed on the bottom 608 of the silicon die 602. In an example, an insulator 614 is coupled below the die, the insulator 614 being of a first thickness $T_1$ along a first portion 616 and a of second thickness $T_2$ less than the first thickness $T_1$ along a second portion 618 surrounded by the first portion, with the first portion 616 and the second portion 618 at least in part defining a cavity 620, with the vibratory diaphragm 604 of the silicon die 602 disposed over the cavity 620 and with the cavity 620 opening to the vibratory diaphragm 604. In an example, a seal 622 surrounds a space defined between the cavity and the vibratory diaphragm to define a sealed cavity 624 and a conductor 626 electrically conductive with and extending from the terminal 612 of the silicon die 602 to a bottom 628 of the insulator 614. In an example, the insulator 614 includes a third portion 630 of a third thickness $T_3$ that is less than the first thickness $T_1$ and thicker than the second thickness $T_2$. In an example, the cavity 620 is a first cavity, and the insulator defines a second cavity 632, with the first cavity 620 defined in a bottom of the second cavity 632, with the silicon die 602 disposed in the second cavity 632. In an example, the seal 622 is a first seal, and comprising a second seal 634 inside the second cavity 632, extending between the insulator 614 and the silicon die 602 to define a second sealed cavity 636 inside the second cavity 632. The top 606 of the silicon die 602 is substantially flush with a top 638 of the insulator 614, according to an example. Traces 640 connect a conductor 626 to a terminal 612 of the silicon die 602.

Figure 7C:
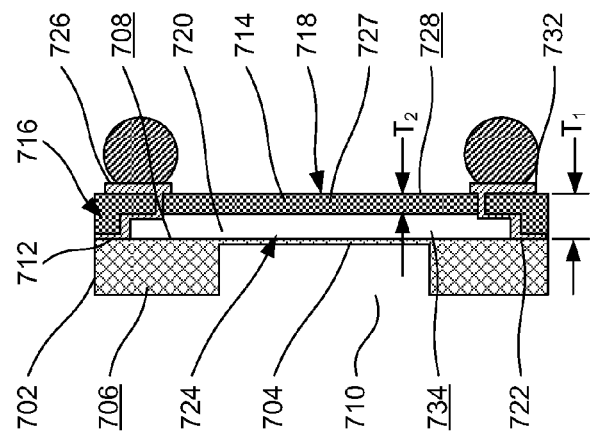
FIG. 7C shows a cross section of FIG. 7A, taken along line 7C-7C.
Figure 7B:
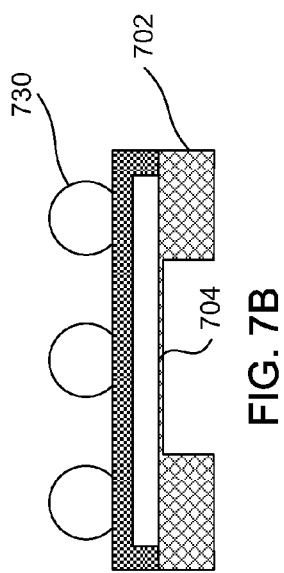
FIG. 7B shows a cross section of FIG. 7A, taken along line 7B-7B.
Figure 7A:
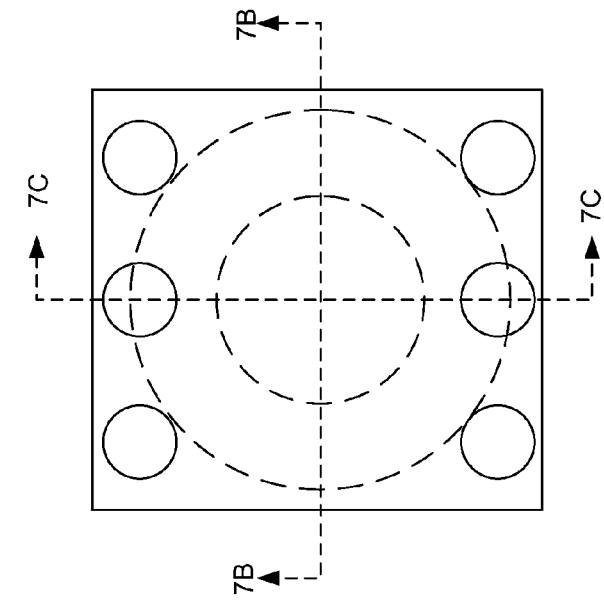
FIG. 7A shows a bottom view of a packaged silicon die including a cap including vias, according to an example.

FIG. 7A shows a top view of a packaged silicon die including a cap including vias, according to an example. FIG. 7B shows a cross section of FIG. 7A, taken along line 7B-7B. FIG. 7C shows a cross section of FIG. 7A, taken along line 7C-7C. In an example, a silicon die 702 includes a vibratory diaphragm 704, a top 706 opposite a bottom 708, with a silicon die port 710 extending through the silicon die 702 to the vibratory diaphragm 704, the silicon die 702 including a terminal 712 disposed on the bottom 708 of the silicon die 702. In an example, an insulator 714 is coupled below the die, the insulator 714 being of a first thickness $T_1$ along a first portion 716 and a of second thickness $T_2$ less than the first thickness $T_1$ along a second portion 718 surrounded by the first portion, with the first portion 716 and the second portion 718 at least in part defining a cavity 720, with the vibratory diaphragm 704 of the silicon die 702 disposed over the cavity 720 and with the cavity 720 opening to the vibratory diaphragm 704. In an example, a seal 722 surrounds a space defined between the cavity and the vibratory diaphragm to define a sealed cavity 724 and a conductor 726 electrically conductive with and extending from the terminal 712 of the silicon die 702 to a bottom 728 of the insulator 714. In an example, terminal balls 730 are physically and electrically coupled to the conductor 726. In an example, a pad 732 is disposed at the bottom of the insulator 727 in electrical communication with the silicon die terminal 712 via the conductor 726.

The insulator 714 comprises a silicon cover with a top 734 opposite a bottom 728, with the cavity 720 disposed in the silicon cover, with the conductor 726 extending through the silicon cover, such as via a through-silicon via, according to an example. An example includes wafer level chip scale packaging. In an example, a single silicon die includes additional electronics, such as an ASIC for signal processing.

Figure 8B:
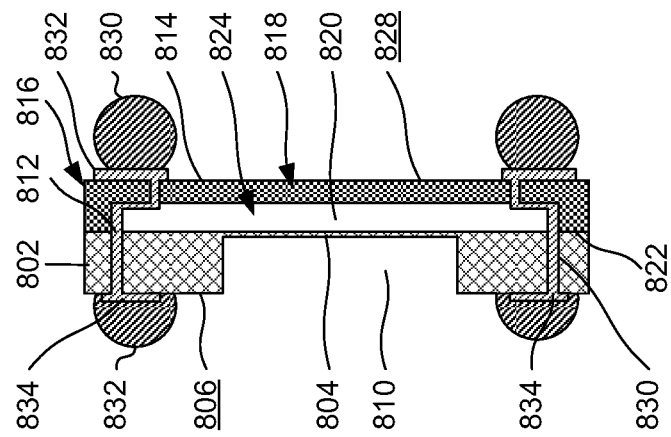
FIG. 8B shows a cross section of FIG. 8A, taken along line 8B-8B.
Figure 8A:
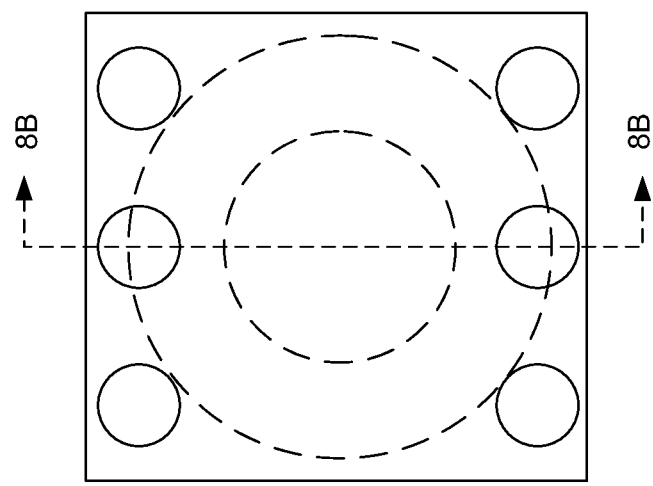
FIG. 8A shows a top view of a packaged silicon die including vias and a cap including vias and terminals, according to an example.

FIG. 8A shows a top view of a packaged silicon die including vias and a cap including vias and one or more terminals, according to an example. FIG. 8B shows a cross section of FIG. 8A, taken along line 8B-8B. In an example, a silicon die 802 includes a vibratory diaphragm 804, a top 806 opposite a bottom 808, with a silicon die port 810 extending through the silicon die 802 to the vibratory diaphragm 804, the silicon die 802 including a terminal 812 disposed on the bottom 808 of the silicon die 802. In an example, an insulator 814 is coupled below the die, the insulator 814 being of a first thickness $T_1$ along a first portion 816 and a of second thickness $T_2$ less than the first thickness $T_1$ along a second portion 818 surrounded by the first portion, with the first portion 816 and the second portion 818 at least in part defining a cavity 820, with the vibratory diaphragm 804 of the silicon die 802 disposed over the cavity 820 and with the cavity 820 opening to the vibratory diaphragm 804. In an example, a seal 822 surrounds a space defined between the cavity and the vibratory diaphragm to define a sealed cavity 824 and a conductor 826 electrically conductive with and extending from the terminal 812 of the silicon die 802 to a bottom 828 of the insulator 814.

In an example, the silicon die 802 includes a second conductor 830 in electrical communication with the terminal 812 of the silicon die 802 and extends through the silicon die 802 to the top 806 of the silicon die 802, with a second terminal 832 such as a solder ball disposed on silicon die top electrically conductive with the second conductor. In an example, the silicon die include contacts 834 on the top surface 806, opposite the bottom surface 808. In an example, the bottom surface 808 includes the vibratory membrane 804. The top contacts are for testing or signal communication, according to an example. In an example, the second conductor 830 that extends through the silicon die 802 includes a through-silicon-via.

In an example gold-Tin Eutectic or equivalent is used for electrical connections between silicon and also as an acoustic cavity seal. In an example, package structure is processed in wafer form, either as wafer to wafer mounting, or singulated unit to wafer.

FIG. 9A shows a top view of a packaged silicon die including a cap between terminals, according to an example. FIG. 9B shows a cross section of FIG. 9A, taken along line 9B-9B. An example includes a vibratory diaphragm assembly 900 that includes a silicon die 902 including a vibratory diaphragm 904 with a silicon die port 910 extending through the silicon die 902 to the vibratory diaphragm 904, the silicon die 902 including a silicon die terminal 912. In an example, a cover 914 is disposed over the silicon die port 910 to define a cavity 916. In an example the cover 914 is conductive. In an example the cover 914 is metallic. In an example, the cavity 916 is disposed over the vibratory diaphragm 904 of the silicon die 902, with the cavity 916 opening to the vibratory diaphragm 904. In an example, terminals 918 can be coupled to the vibratory diaphragm assembly 900 in electrical communication with the silicon die terminal 912, the terminals disposed on a bottom surface 920 of the vibratory diaphragm assembly 900, with the cavity 916 located below the bottom surface 920 of the vibratory diaphragm assembly 900, with the terminals 918 laterally spaced on opposite sides 922, 924 of the cavity 916. The cover is of a first thickness $T_1$ along a first portion 926 and of second thickness $T_2$ less than the first thickness $T_1$ along a second portion 928 surrounded by the first portion 926. In an example, the first portion 926 and the second portion 928 define the cavity 916. In an example, the terminals 918 are affixed to the silicon die 902.

Figure 10B:
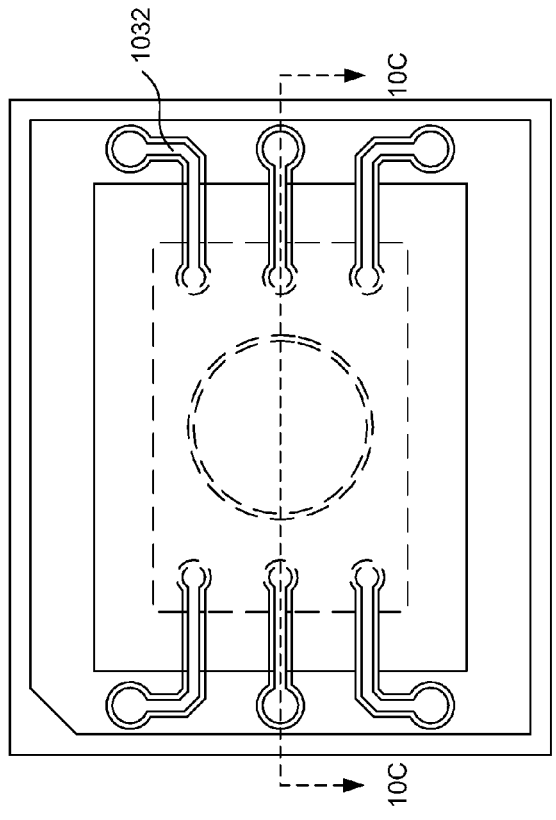
FIG. 10B shows a bottom view of a silicon mount for a silicon die, according to an example.
Figure 10C:
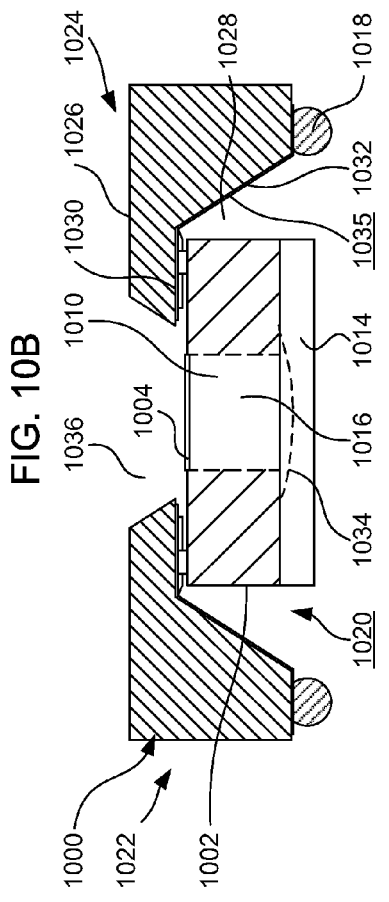
FIG. 10C shows a cross section of the silicon mount of FIG. 10B, taken along line 10B-10B, with the silicon die of FIG. 10A mounted to the silicon mount, according to an example.
Figure 10A:
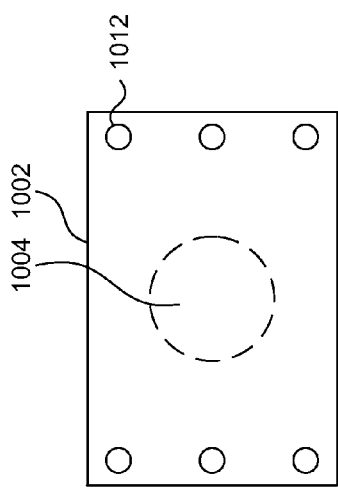
FIG. 10A shows a top view of a silicon die, according to an example.

FIG. 10A shows a top view of a silicon die, according to an example. FIG. 10B shows a bottom view of a silicon mount for a silicon die, according to an example. FIG. 10C shows a cross section of the silicon mount of FIG. 10B, taken along line 10B-10B, with the silicon die of FIG. 10A mounted to the silicon mount, according to an example. An example includes a vibratory diaphragm assembly 1000 that includes a silicon die 1002 including a vibratory diaphragm 1004 with a silicon die port 1010 extending through the silicon die 1002 to the vibratory diaphragm 1004, the silicon die 1002 including a silicon die terminal 1012. In an example, a cover 1014 is disposed over the silicon die port 1010 to define a cavity 1016. In an example, the cavity 1016 is disposed over the vibratory diaphragm 1004 of the silicon die 1002, with the cavity 1016 opening to the vibratory diaphragm 1004. In an example, terminals 1018 can be coupled to the vibratory diaphragm assembly 1000 in electrical communication with the silicon die terminal 1012, the terminals disposed on a bottom surface 1020 of the vibratory diaphragm assembly 1000, with the cavity 1016 located below the bottom surface 1020 of the vibratory diaphragm assembly 1000, with the terminals 1018 laterally spaced on opposite sides 1022, 1024 of the cavity 1016.

In an example, a silicon carrier 1026 defining a carrier cavity 1028, with the silicon die 1002 disposed in the carrier cavity 1028 on a bottom surface 1035 of the silicon carrier 1026. A conductor 1032 extends between one of the terminals 1018 and a silicon die terminal 1030 and is disposed on the bottom surface 1035 of the silicon carrier 1026. In an example, the silicon carrier 1026 defines a port 1036 disposed over the vibratory diaphragm 1004. In an example, the cover 1014 includes a silicon cap disposed over the silicon die port 1010, below the vibratory diaphragm 1004. In an example, the cover defines an optional cover cavity 1034 opening to the silicon die port 1010.

Figure 11:
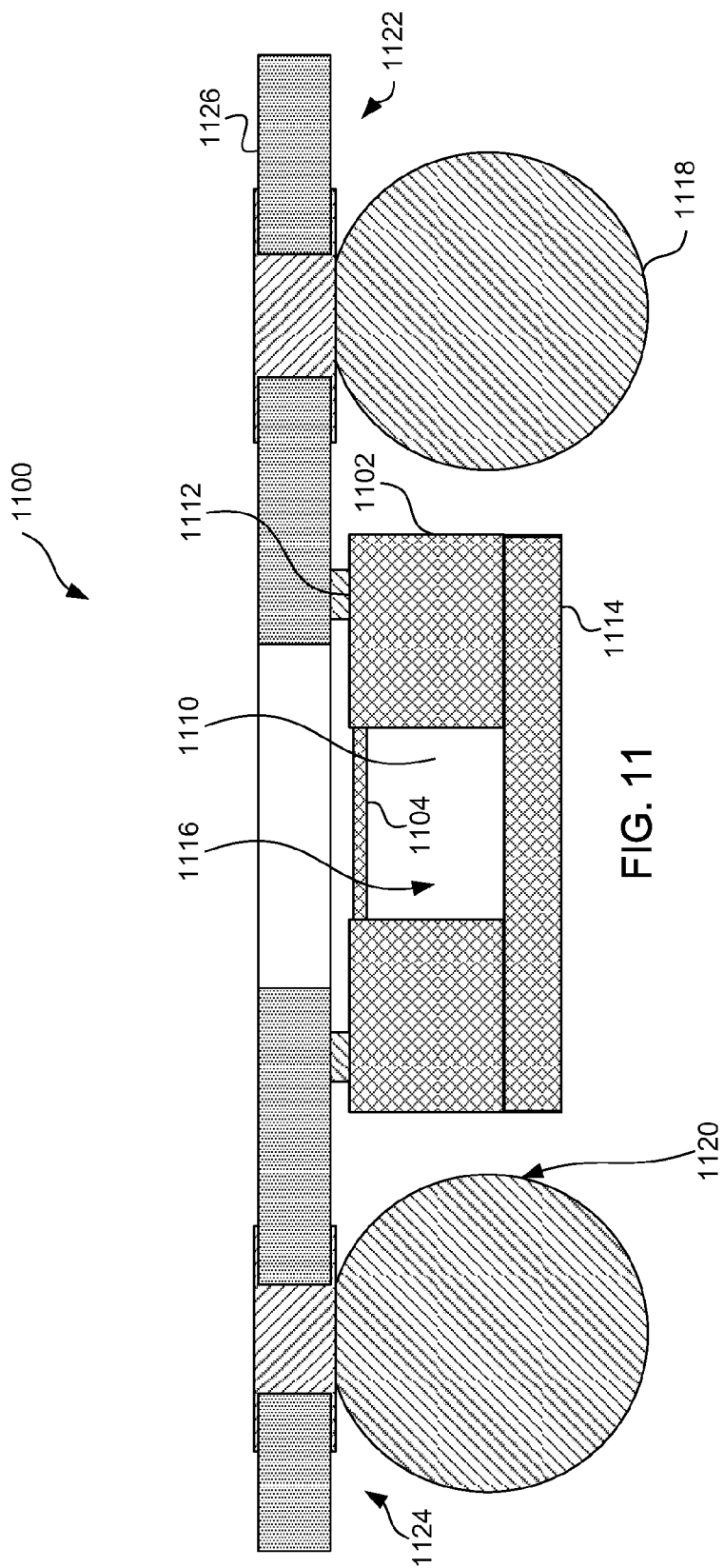
FIG. 11 is a cross section of a silicon die mounted between substrate terminals, according to an example.

FIG. 11 is a cross section of a silicon die mounted between substrate terminals, according to an example. An example includes a vibratory diaphragm assembly 1100 that includes a silicon die 1102 including a vibratory diaphragm 1104 with a silicon die port 1110 extending through the silicon die 1102 to the vibratory diaphragm 1104, the silicon die 1102 including a silicon die terminal 1112. In an example, a cover 1114 is disposed over the silicon die port 1110 to define a cavity 1116. In an example, the cavity 1116 is disposed over the vibratory diaphragm 1104 of the silicon die 1102, with the cavity 1116 opening to the vibratory diaphragm 1104. In an example, terminals 1118 can be coupled to the vibratory diaphragm assembly 1100 in electrical communication with the silicon die terminal 1112, the terminals disposed on a bottom surface 1120 of the vibratory diaphragm assembly 1100, with the cavity 1116 located below the bottom surface 1120 of the vibratory diaphragm assembly 1100, with the terminals 1118 laterally spaced on opposite sides 1122, 1124 of the cavity 1116. An example includes a substrate 1126, with the silicon die 1102 coupled to the substrate 1126, and the terminals 118 coupled to the substrate 1126.

Figure 12A:
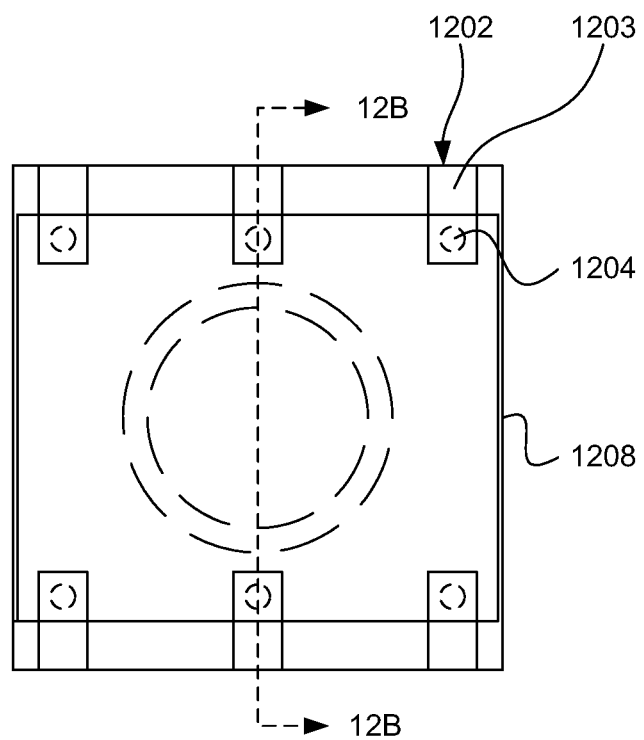
FIG. 12A shows a top view of a packaged silicon die including standoffs and a molded conductive frame, according to an example.
Figure 12B:
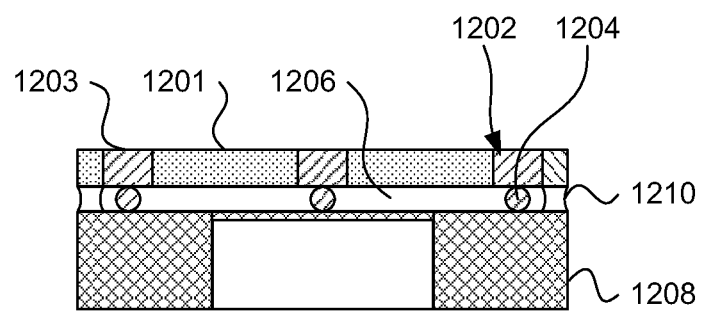
FIG. 12B shows a cross section of FIG. 12A, taken along line 12B-12B.

FIG. 12A shows a top view of a packaged silicon die including standoffs and a molded conductive frame, according to an example. FIG. 12B shows a cross section of FIG. 12A, taken along line 12B-12B. In an example, a molded conductive frame 1202 includes a premolded flat frame including mold compound 1201 and conductor 1203. Terminal balls 1204 such as solder balls create a cavity 1206 between a silicon die 1208 and the premolded flat frame 1202 according to an example. An adhesive 1210 contributes to seal the cavity 1206, according to an example.

Figure 13B:
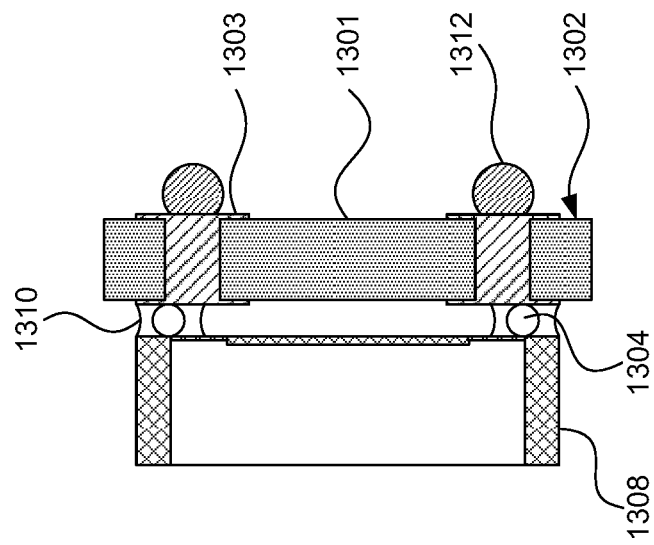
FIG. 13B shows a cross section of FIG. 13A, taken along line 13B-13B.
Figure 13A:
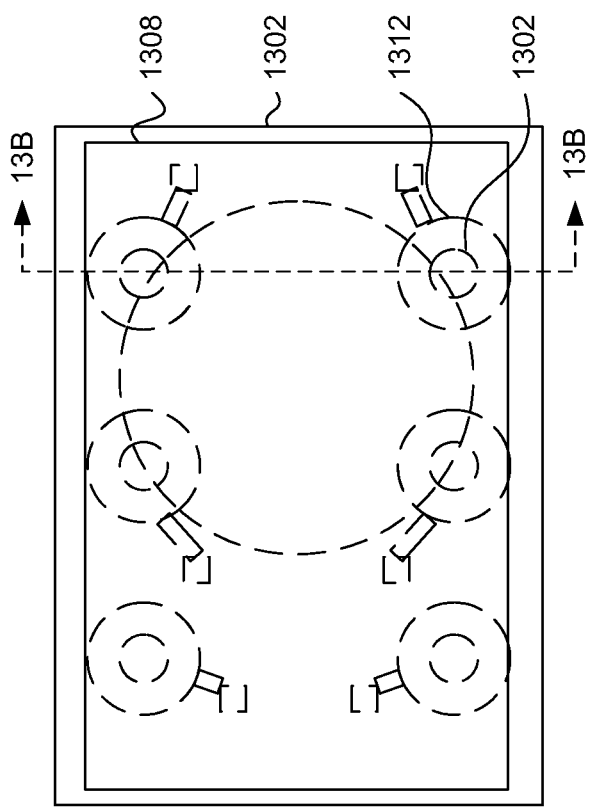
FIG. 13A shows a top view of a packaged silicon die including a substrate and standoffs, according to an example.

FIG. 13A shows a top view of a packaged silicon die including a substrate and standoffs, according to an example. FIG. 13B shows a cross section of FIG. 13A, taken along line 13B-13B. In an example, a substrate 1302 includes a printed circuit board including organic material 1301 and conductor 1303. Terminal balls 1304 such as solder balls create a cavity 1306 between a silicon die 1308 and the substrate 1302 according to an example. An adhesive 1310 contributes to seal the cavity 1306, according to an example. Optional terminal balls 1312 are coupled to the conductor 1303 of the substrate.

Additional Notes

Example 1 optionally includes a conductive frame, a silicon die coupled to the conductive frame, the silicon die including a vibratory diaphragm, the die having a silicon die top opposite a silicon die bottom, with a silicon die port extending through the silicon die to the vibratory diaphragm, with a silicon die terminal in electrical communication with the conductive frame and an insulator or insulator means affixed to the conductive frame and the silicon die, with the insulator or insulator means extending through interstices in the conductive frame to a conductive frame bottom of the conductive frame, and around an exterior of the silicon die to the silicon die top, with the insulator or insulator means physically affixed to the silicon die and to the conductive frame, with the silicon die port exposed and with a conductive frame terminal disposed at the conductive frame bottom in electrical communication with the silicon die terminal.

Example 2 optionally includes example 1, wherein the silicon die optionally includes a microelectricalmechanical system (MEMs) microphone and the vibratory diaphragm optionally includes a membrane of the MEMs microphone, wherein the silicon die port extends to the membrane and the silicon die port is exposed.

Example 3 optionally includes any one or more of the examples 1-2, wherein the conductive frame optionally includes a cavity disposed in the conductive frame top, with the vibratory diaphragm exposed to the cavity.

Example 4 optionally includes any one or more of the examples 1-3, wherein the cavity is a half-etched cavity.

Example 5 optionally includes any one or more of the examples 1-4, wherein the insulator or insulator means optionally includes a mold compound.

Example 6 optionally includes any one or more of the examples 1-5, wherein an exterior of the apparatus is shaped like a hexahedron including six substantially continuous surfaces.

Example 7 optionally includes any one or more of the examples 1-6, wherein a ball terminal physically and electrically couples the silicon die to the conductive frame.

Example 8 optionally includes any one or more of the examples 1-7, wherein a second conductive frame overlays the silicon die top, with the insulator or insulator means extending through interstices of the second conductive frame, wherein the second conductive frame defines a conductive frame port, with the silicon die exposed through the conductive frame port.

Example 9 optionally includes example 8, wherein the silicon die terminal is electrically connected to a second conductive frame terminal of the second conductive frame, with the second conductive frame terminal exposed at a top of the second conductive frame.

Example 10 optionally includes any one or more of the examples 1-8, wherein the second conductive frame optionally includes a second cavity, with the silicon die top disposed in the second cavity.

Example 11 optionally includes any one or more of the examples 1-10, wherein the second cavity is a half-etched cavity.

Example 12 optionally includes a silicon die including a vibratory diaphragm, the die having a silicon die top opposite a silicon die bottom, with a silicon die port extending through the silicon die to the vibratory diaphragm, the silicon die including a silicon die terminal disposed on the bottom of the silicon die, an insulator or insulator means coupled below the die, the insulator or insulator means being of a first thickness along a first portion and a of second thickness less than the first thickness along a second portion surrounded by the first portion, with the first portion and the second portion defining a cavity, with the vibratory diaphragm of the silicon die disposed over the cavity and with the cavity opening to the vibratory diaphragm, a seal surrounding a space defined between the cavity and the vibratory diaphragm to define a sealed cavity and a conductor electrically conductive with and extending from the silicon die terminal to a bottom of the insulator or insulator means.

Example 13 optionally includes example 12, comprising a conductive frame with a conductive frame top opposite a conductive frame bottom, the silicon die mounted to the conductive frame top with a conductive frame port extending through the conductive frame from the conductive frame top to the conductive frame bottom, wherein the insulator or insulator means is molded into the conductive frame port.

Example 14 optionally includes any one or more of the examples 12-13, wherein the conductor optionally includes a portion of the bottom of the conductive frame and is flush with the bottom of the insulator or insulator means.

Example 15 optionally includes any one or more of the examples 12-14, wherein the silicon die optionally includes a MEMs microphone that optionally includes the vibratory diaphragm, with the silicon die port extending from the silicon die top to the vibratory diaphragm.

Example 16 optionally includes any one or more of the examples 12-15, wherein the insulator or insulator means optionally includes a printed circuit board with a top opposite a bottom, the silicon die mounted to the top of the printed circuit board, with the cavity disposed into the printed circuit board.

Example 17 optionally includes example 16, wherein the cavity is excised in the printed circuit board.

Example 18 optionally includes any one or more of the examples 12-17, wherein the conductor optionally includes a via through the printed circuit board.

Example 19 optionally includes any one or more of the examples 12-18, wherein the seal optionally includes an adhesive adhering the silicon die to the printed circuit board.

Example 20 optionally includes any one or more of the examples 12-19, wherein the printed circuit is a multilayer printed circuit board, with a the silicon die terminal coupled to a conductive layer disposed between two layers of the printed circuit board.

Example 21 optionally includes any one or more of the examples 12-20, wherein the cavity is a first cavity, and the insulator or insulator means defines a second cavity, with the first cavity defined in a bottom of the second cavity, with the silicon die disposed in the second cavity.

Example 22 optionally includes example 21, wherein the silicon die top is substantially flush with a top of the insulator or insulator means.

Example 23 optionally includes any one or more of the examples 1-22, wherein the seal is a first seal, and comprising a second seal inside the second cavity, extending between the insulator or insulator means and the silicon die to define a second sealed cavity inside the second cavity.

Example 24 optionally includes any one or more of the examples 12-23, wherein the insulator or insulator means comprises a silicon cover with a top opposite a bottom, with the cavity disposed in the silicon cover, with the conductor extending through the silicon cover.

Example 25 optionally includes example 24, wherein the conductor optionally includes a through-silicon-via.

Example 26 optionally includes any one or more of the examples 12-25, wherein a second conductor is in electrical communication with the silicon die terminal and extends through the silicon die to the silicon die top, with a second silicon die terminal disposed on silicon die top electrically conductive with the second conductor.

Example 27 optionally includes any one or more of the examples 12-26, wherein a second conductor is in electrical communication with a second silicon die terminal and extends through the silicon die to the silicon die top.

Example 28 optionally includes a vibratory diaphragm assembly, including a silicon die including a vibratory diaphragm with a silicon die port extending through the silicon die to the vibratory diaphragm, the silicon die including a silicon die terminal and a cover coupled to the die to define a cavity, with the cavity disposed over the vibratory diaphragm of the silicon die, with the cavity opening to the vibratory diaphragm and terminals coupled to the vibratory diaphragm assembly in electrical communication with the silicon die terminal, the terminals disposed on a bottom surface of the vibratory diaphragm assembly, with the cavity located below the bottom surface of the vibratory diaphragm assembly, with the terminals laterally spaced on opposite sides of the cavity.

Example 29 optionally includes example 28, wherein the cover is of a first thickness along a first portion and of second thickness less than the first thickness along a second portion that is surrounded by the first portion.

Example 30 include example 29, wherein the first portion and the second portion define the cavity.

Example 31 optionally includes any one or more of the examples 28-30, wherein the terminals are affixed to the silicon die.

Example 32 optionally includes any one or more of the examples 28-31, comprising a silicon carrier defining a carrier cavity, with the silicon die disposed in the cavity on a bottom surface of the silicon carrier.

Example 33 optionally includes example 32, wherein a conductor extends between one of the terminals and the silicon die terminal and is disposed on the bottom surface of the silicon carrier.

Example 34 optionally includes any one or more of the examples 28-33, wherein the silicon carrier defines a carrier port disposed over the vibratory diaphragm.

Example 35 optionally includes examples 34, wherein the cover optionally includes a silicon cap disposed over the silicon die port, below the vibratory diaphragm.

Example 36 optionally includes any one or more of the examples 28-35, wherein the cover defines a cover cavity that opens to the silicon die port.

Example 37 optionally includes any one or more of the examples 28-36, comprising a substrate, with the silicon die coupled to the substrate, and the terminals coupled to the substrate.

In Example 38, a system or apparatus can include, or can optionally be combined with any portion or combination of any portions of any one or more of Examples 1-37 to include, means for performing any one or more of the functions of Examples 1-37, or a machine-readable medium including instructions that, when performed by a machine, cause the machine to perform any one or more of the functions of Examples 1-37.

Various method examples are contemplated. An example includes coupling a silicon die to a conductive frame, the silicon die including a vibratory diaphragm, the die having a silicon die top opposite a silicon die bottom, with a silicon die port extending through the silicon die to the vibratory diaphragm. An example includes coupling a silicon die terminal in electrical communication with the conductive frame. An example includes forming an insulator or insulator means onto the conductive frame and the silicon die, with the insulator or insulator means extending through interstices in the conductive frame to a bottom of the conductive frame, and around an exterior of the silicon die to a silicon die top, with the insulator or insulator means physically affixed to the silicon die and to the conductive frame, with the silicon die port exposed and with a conductive frame terminal disposed at a bottom of the conductive frame in electrical communication with the silicon die terminal. An example includes forming the insulator or insulator means such that the silicon die port is exposed to an atmosphere. An example includes disposing a cavity in the conductive frame top, with the vibratory diaphragm exposed to the cavity. An example includes half-etching the cavity in the conductive frame. An example includes insulating one or both of a conductive frame from a silicon die using a mold compound. An example includes forming a packaged silicon die into a hexahedron shape including six substantially continuous surfaces. An example includes affixing a ball terminal physically and electrically to each of the silicon die to the conductive frame. An example includes overlaying a second conductive frame over the silicon die top, with the insulator or insulator means extending through interstices of the second conductive frame, wherein the second conductive frame defines a port, with the silicon die exposed through the port. An example includes electrically connecting a silicon die terminal to a terminal of the second conductive frame, with the terminal of the second conductive frame exposed at a top of the second conductive frame. An example includes disposing the silicon die in a second cavity disposed in the second conductive frame. An example includes half-etching the second cavity in the second conductive frame.

An example includes coupling a silicon die below an insulator or insulator means, the silicon die including a vibratory diaphragm, the die having a silicon die top opposite a silicon die bottom, with a silicon die port extending through the silicon die to the vibratory diaphragm, the silicon die including a terminal disposed on the bottom of the silicon die. An example includes coupling the insulator or insulator means below the die, the insulator or insulator means being of a first thickness along a first portion and a of second thickness less than the first thickness along a second portion surrounded by the first portion, with the first portion and the second portion defining a cavity. An example includes disposing the vibratory diaphragm of the silicon die over the cavity with the cavity opening to the vibratory diaphragm. An example includes sealing a space around cavity and the vibratory diaphragm to define a sealed cavity. An example includes electrically connecting a conductor with the terminal of the silicon, and exposing the conductor at a bottom of the insulator or insulator means via forming of the insulator or insulator means. An example includes forming the insulator or insulator means around the conductive frame having a conductive frame top opposite a conductive frame bottom, and mounting the silicon die to the conductive frame top with a frame port extending through the conductive frame from the conductive frame top to the conductive frame bottom, and molding the insulator or insulator means into the conductive frame port. An example includes forming the insulator or insulator means flush with a bottom of the conductive frame. An example includes providing a silicon die including a MEMs microphone that includes the vibratory diaphragm, and orienting the silicon with a die port extending from the silicon die top to the vibratory diaphragm. An example includes providing an insulator or insulator means including a printed circuit board with a top opposite a bottom, the silicon die mounted to the top of the printed circuit board, with the cavity disposed into the printed circuit board. An example includes excising the cavity in the printed circuit board. An example includes disposing a via of the conductor through the printed circuit board. An example includes sealing the cavity with an adhesive adhering the silicon die to the printed circuit board. An example includes printing a multilayer printed circuit board, and coupling a the silicon die terminal to a conductive layer disposed between two layers of the printed circuit board. An example includes forming an insulator or insulator means wherein the cavity is a first cavity, and the insulator or insulator means defines a second cavity, with the first cavity defined in a bottom of the second cavity, with the silicon die disposed in the second cavity. An example includes mounting the silicon die top substantially flush with a top of the insulator or insulator means. An example includes sealing the second cavity with a second inside the second cavity, the second seal extending between the insulator or insulator means and the silicon die to define the second sealed cavity inside the second cavity. An example includes disposing an insulator or insulator means including a silicon cover with a top opposite a bottom onto the silicon die, with the cavity disposed in the silicon cover, with the conductor extending through the silicon cover. An example includes forming a through-silicon-via in the cover. An example includes forming a second conductor through the silicon die, in electrical communication with the silicon die terminal, and disposing a second terminal on silicon die top electrically conductive with the second conductor. An example includes using placing the second conductor in electrical communication with a second silicon die terminal extending through the silicon die to the silicon die top.

An example includes assembling a vibratory diaphragm assembly including a silicon die including a vibratory diaphragm, the die having a first side opposite a second side, with a silicon die port extending through the silicon die to the vibratory diaphragm, the silicon die including a terminal disposed on the first side of the silicon die and a cover coupled to the die to define a cavity, with the vibratory diaphragm of the silicon die disposed over the cavity, with the cavity opening to the vibratory diaphragm. An example includes forming terminals on to the vibratory diaphragm assembly in electrical communication with the silicon die and disposing the terminals on a bottom surface of the vibratory diaphragm assembly, with the cavity located below the bottom surface of the vibratory diaphragm assembly. An example includes spacing the terminals on opposite sides of the cavity. An example includes a cover of a first thickness along a first portion and of second thickness less than the first thickness along a second portion that is surrounded by the first portion. An example includes forming the cavity with the first portion and the second portion. An example includes affixing the terminals to the silicon die. An example includes providing a silicon carrier defining a carrier cavity, and disposing the silicon die in the cavity on a bottom surface of the silicon carrier. An example includes extending a conductor between one of the terminals and a silicon die terminal and disposing the conductor on the bottom surface of the silicon carrier. An example includes forming a carrier port in the silicon carrier and disposing the carrier port over the vibratory diaphragm. An example includes disposing a silicon cap over the silicon die port below the vibratory diaphragm. An example includes defining a cover cavity that opens to the silicon die port. An example includes affixing terminals to the cover, and affixing the silicon die to the cover, wherein the cover includes a substrate, coupling the terminals to the substrate, and coupling the silicon die coupled to the substrate.

The above detailed description includes references to the accompanying drawings, which form a part of the detailed description. The drawings show, by way of illustration, specific embodiments in which the invention can be practiced. These embodiments are also referred to herein as "examples."

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
    a conductive frame;
    a silicon die coupled to the conductive frame, the silicon die including a vibratory diaphragm, the die having a silicon die top opposite a silicon die bottom, with a silicon die port extending through the silicon die to the vibratory diaphragm, with a silicon die terminal in electrical communication with the conductive frame; and
    an insulator affixed to the conductive frame and the silicon die, with the insulator extending through interstices in the conductive frame to a conductive frame bottom of the conductive frame, and around an exterior of the silicon die to the silicon die top, with the insulator physically affixed to the silicon die and to the conductive frame, with the silicon die port exposed and with a conductive frame terminal disposed at the conductive frame bottom in electrical communication with the silicon die terminal.

2. The apparatus of claim 1, wherein the silicon die includes a microelectricalmechanical system (MEMs) microphone and the vibratory diaphragm includes a membrane of the MEMs microphone, wherein the silicon die port extends to the membrane and the silicon die port is exposed.

3. The apparatus of claim 1, wherein the conductive frame includes a cavity disposed in a conductive frame top, with the vibratory diaphragm exposed to the cavity, wherein the cavity is a half-etched cavity.

4. The apparatus of claim 1, wherein the insulator includes a mold compound.

5. The apparatus of claim 1, wherein a second conductive frame overlays the silicon die top, with the insulator extending through interstices of the second conductive frame, wherein the second conductive frame defines a conductive frame port, with the silicon die exposed through the conductive frame port, wherein the silicon die terminal is electrically connected to a second conductive frame terminal of the second conductive frame, with the second conductive frame terminal exposed at a top of the second conductive frame, wherein the second conductive frame includes a second cavity, with the silicon die top disposed in the second cavity.

6. An apparatus comprising:
a silicon die including a vibratory diaphragm, the die having a silicon die top opposite a silicon die bottom, with a silicon die port extending through the silicon die to the vibratory diaphragm, the silicon die including a silicon die terminal disposed on the bottom of the silicon die;
an insulator coupled below the die, the insulator being of a first thickness along a first portion and a of second thickness less than the first thickness along a second portion surrounded by the first portion, with the first portion and the second portion defining a cavity, with the vibratory diaphragm of the silicon die disposed over the cavity and with the cavity opening to the vibratory diaphragm;
a seal surrounding a space defined between the cavity and the vibratory diaphragm to define a sealed cavity; and
a conductor electrically conductive with and extending from the silicon die terminal to a bottom of the insulator.

7. The apparatus of claim 6, comprising a conductive frame with a conductive frame top opposite a conductive frame bottom, the silicon die mounted to the conductive frame top with a conductive frame port extending through the conductive frame from the conductive frame top to the conductive frame bottom, wherein the insulator is molded into the conductive frame port, wherein the conductor includes a portion of the bottom of the conductive frame and is flush with the bottom of the insulator.

8. The apparatus of claim 6, wherein the insulator includes a printed circuit board with a top opposite a bottom, the silicon die mounted to the top of the printed circuit board, with the cavity disposed into the printed circuit board.

9. The apparatus of claim 8, wherein the printed circuit is a multilayer printed circuit board, with a the silicon die terminal coupled to a conductive layer disposed between two layers of the printed circuit board.

10. The apparatus of claim 6, wherein the cavity is a first cavity, and the insulator defines a second cavity, with the first cavity defined in a bottom of the second cavity, with the silicon die disposed in the second cavity.

11. The apparatus of claim 10, wherein the seal is a first seal, and comprising a second seal inside the second cavity, extending between the insulator and the silicon die to define a second sealed cavity inside the second cavity.

12. The apparatus of claim 6, wherein the insulator comprises a silicon cover with a top opposite a bottom, with the cavity disposed in the silicon cover, with the conductor extending through the silicon cover.

13. The apparatus of claim 12, wherein a second conductor is in electrical communication with the silicon die terminal and extends through the silicon die to the silicon die top, with a second silicon die terminal disposed on silicon die top electrically conductive with the second conductor.

14. The apparatus of claim 12, wherein a second conductor is in electrical communication with a second silicon die terminal and extends through the silicon die to the silicon die top.

15. An apparatus comprising:
a vibratory diaphragm assembly, including:
a silicon die including a vibratory diaphragm with a silicon die port extending through the silicon die to the vibratory diaphragm, the silicon die including a silicon die terminal; and
a cover coupled to the die to define a cavity, with the cavity disposed over the vibratory diaphragm of the silicon die, with the cavity opening to the vibratory diaphragm; and
terminals coupled to the vibratory diaphragm assembly in electrical communication with the silicon die terminal, the terminals disposed on a bottom surface of the vibratory diaphragm assembly, with the cavity located below the bottom surface of the vibratory diaphragm assembly, with the terminals laterally spaced on opposite sides of the cavity.

16. The apparatus of claim 15, wherein the cover is of a first thickness along a first portion and of second thickness less than the first thickness along a second portion that is surrounded by the first portion, wherein the first portion and the second portion define the cavity.

17. The apparatus of claim 16, wherein the terminals are affixed to the silicon die.

18. The apparatus of claim 15, comprising a silicon carrier defining a carrier cavity, with the silicon die disposed in the cavity on a bottom surface of the silicon carrier, wherein a conductor extends between one of the terminals and the silicon die terminal and is disposed on the bottom surface of the silicon carrier, wherein the silicon carrier defines a carrier port disposed over the vibratory diaphragm, wherein the cover includes a silicon cap disposed over the silicon die port, below the vibratory diaphragm.

19. The apparatus of claim 18, wherein the cover defines a cover cavity that opens to the silicon die port.

20. The apparatus of claim 15, comprising a substrate, with the silicon die coupled to the substrate, and the terminals coupled to the substrate.

* * * * *